United States Patent [19]

Fushimi

[11] 4,221,963
[45] Sep. 9, 1980

[54] LIGHT CHOPPING DISC FOR A PULSE GENERATOR

[75] Inventor: Akihiro Fushimi, Saitama, Japan

[73] Assignee: Pioneer Electronic Corporation, Tokyo, Japan

[21] Appl. No.: 915,098

[22] Filed: Jun. 13, 1978

[30] Foreign Application Priority Data

Jun. 13, 1977 [JP] Japan .................. 52/76823[U]

[51] Int. Cl.² ........................................... G01D 5/34
[52] U.S. Cl. ........................ 250/231 SE; 250/237 G
[58] Field of Search ......... 250/231 R, 231 SE, 237 R, 250/237 G; 324/175; 356/395

[56] References Cited

U.S. PATENT DOCUMENTS

| 1,016,753 | 2/1912 | Leumann | 250/237 R |
| 2,383,321 | 8/1945 | Kleber | 250/231 R |
| 2,437,608 | 3/1948 | Long et al. | 250/231 R |
| 2,453,693 | 11/1948 | Armstrong et al. | 250/231 R |
| 2,666,650 | 1/1954 | MacDonell | 250/231 R |

*Primary Examiner*—David C. Nelms
*Attorney, Agent, or Firm*—Sughrue, Rothwell, Mion, Zinn and Macpeak

[57] ABSTRACT

The effect of light reflected from the inner walls of the slits in a light chopping disc is substantially eliminated by tapering the slits so that the aperture facing the light source is larger than that facing the light detector. A gear drive is also provided for increasing the number of pulses generated during each revolution of the tuning knob.

6 Claims, 9 Drawing Figures

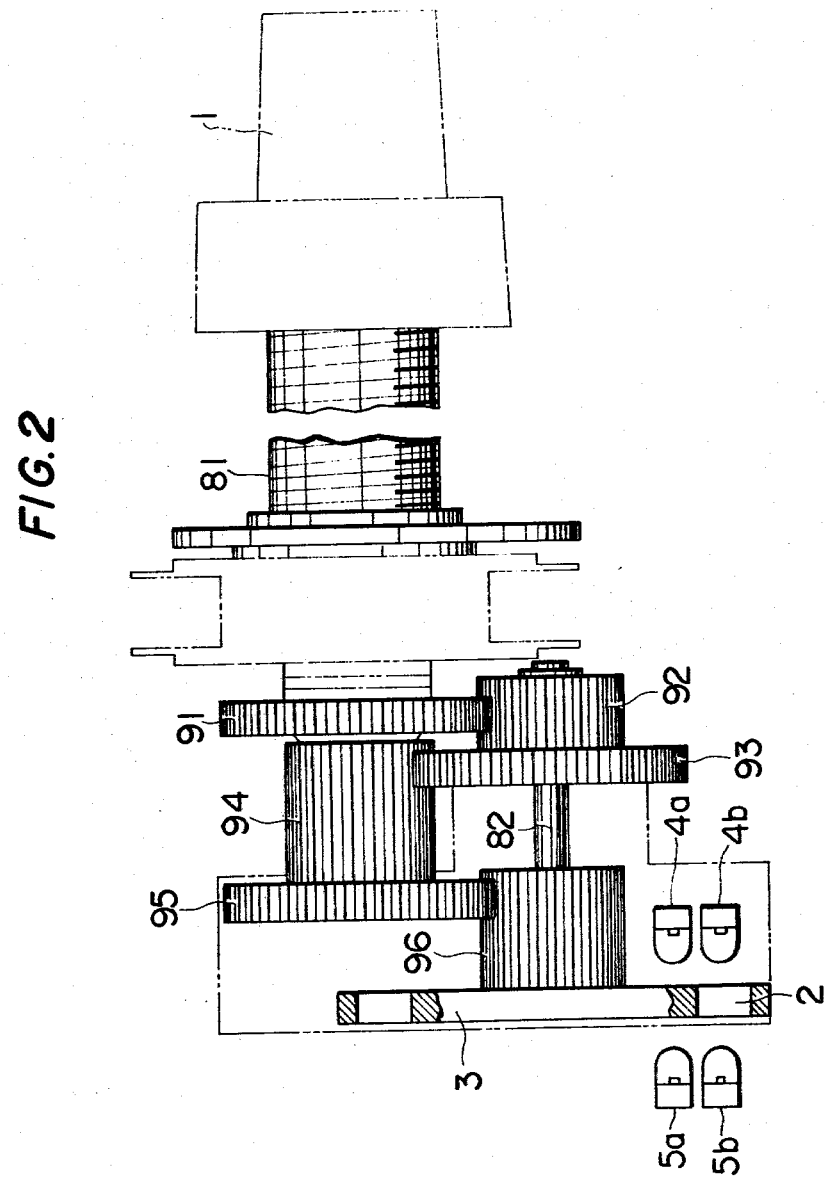

LIGHT CHOPPING DISC FOR A PULSE GENERATOR

BACKGROUND OF THE INVENTION

This invention relates to a tuning pulse generator for use in an electronic preset receiver, and more particularly to a tuning pulse generator of the type wherein tuning pulses are mechanically generated in accordance with the manual operation of a tuning knob.

Due to rapid and remarkable progress in the field of electronic techniques, various improvements for receivers have been proposed. Recently, one of such improvements is an electronic preset receiver in which a pulse generator is provided for generating up pulses and down pulses in accordance with the manual operation of the tuning knob. The output of the pulse generator is counted by an up-down counter, the output of which is digital-to-analog converted by a digital-to-analog converter to supply an analog signal to a varactor diode in the tuning section.

A conventional pulse generator is constructed as shown in FIG. 1 where the tuning knob 1 is directly connected to a disc 3 via a shaft so as to be interlocking therewith. The disc 3 has a plurality of slits 2 concentrically formed in its surface. A pair of light emitting elements 4a and 4b, e.g., light emitting diodes, are disposed at one side of the disc 3 spaced at some distance therefrom. Similarly, a pair of light receiving elements 5a and 5b, e.g., photo-transistors, are disposed at the opposite side thereof. The light emitted from the elements 4a and 4b is passed through the slits 2 and sensed by the elements 5a and 5b, respectively. The optical couplings between the elements 4a and 5a and between the elements 4b and 5b are both intermittent as the disc 3 turns. The thus constructed device generates up-down pulses and clock pulses by turning the tuning knob 1. The direction the disc 3 is turned determines whether up or down pulses are generated. In case that the up pulses are generated when the disc 3 is turned counterclockwise, the elements 5a and 5b are so arranged that the phase of the output of the element 5a is delayed by 90° with respect to that of the element 5b. In this case, the outputs of the elements 5a and 5b provide up-down pulses and clock pulses, respectively. Owing to the turning direction of the disc 3, two kinds of output waveforms of the elements 5a and 5b are obtained as shown in FIGS. 6(a) and 6(b), in which FIG. 6(a) shows the case of up count and FIG. 6(b), down count. As can be appreciated from FIG. 6(a) the up-down pulse is at a high level in the case of up count whenever the clock pulse changes its level from low to high. Conversely, in the case of down count, the up-down pulse is at a low level whenever the clock pulse changes its level from low to high as shown in FIG. 6(b).

According to the tuning pulse generator thus constructed, however, various disadvantages are encountered. One of those is that the number of pulses generated with respect to one turn of the tuning knob is relatively small. Further, the counter sometimes misoperates or the operation of the counter is liable to be unstable due to the inner wall configuration of the slit as shown in FIG. 3. Specifically, since the area of the light spot on the disc 3 received from the light emitting element is much larger than the area of slit, a part of the irradiated light emitted therefrom impinges upon the inner wall of the slit and then the reflected light enters into the light receiving element. On the other hand, since the light receiving area in the light receiving element is larger than the area of the slit, the light receiving element receives the light even when the slit is slightly displaced. As a result, unwanted light is sensed by the elements 5a and/or 5b, the outputs of which are distorted in such a manner that the changing point of the output level from low to high and vice versa is smoothly rising or falling just like a sinusoidal waveform. Therefore, the prevention and the passage of light cannot be sharply carried out due to the inner wall configuration of the slit formed in parallel to the optical axis.

SUMMARY OF THE INVENTION

Accordingly, an object of this invention is to provide an improved pulse generator eliminating the aforementioned disadvantages. According to this invention, a speed increment gear mechanism is employed between the tuning knob and the disc to increase the number of pulses generated by the disc, and the inner wall configuration of the slit is designed so that the reflected light in the inner wall does not enter into the light receiving element.

BRIEF DESCRIPTION OF THE DRAWINGS

FIG. 2 shows the speed increment gear mechanism according to this invention;

DETAILED DESCRIPTION OF THE INVENTION

Figure 1:
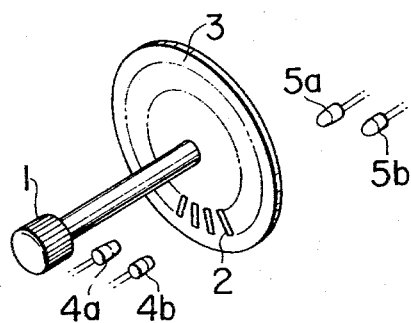
FIG. 1 is a perspective view showing the conventional pulse generator.

The tuning pulse generator according to this invention will now be described in detail with reference to the accompanying drawings.

A speed increment gear mechanism will be firstly described with reference to FIG. 2. A tuning knob 1 is secured to one end of a first shaft 81 and a first gear 91 is fixedly secured to the other end thereof. The first gear 91 engages a second gear 92 which is loosely secured to a second shaft 82 in parallel to the first shaft 81, wherein the number of teeth of the second gear 92 is smaller than that of the first gear 91. A third gear 93 integrally provided with the second gear 92 engages a fourth gear 94 which is loosely secured to the shaft 81, wherein the number of teeth of the fourth gear 94 is smaller than that of the third gear 93. A fifth gear is integrally provided with the fourth gear 94 and engages a sixth gear 96 with which a disc 3 is integrally provided. The disc 3 and the sixth gear 96 are loosely secured to the second shaft 83 and the number of teeth of the sixth gear 96 is smaller than that of the fifth gear 95.

The operation of the thus constructed speed increment gear mechanism will be briefly described. When the tuning knob 1 is turned in either the up direction or down direction, the first gear 91 fixedly secured to the first shaft 81 rotates the second gear 92 loosely secured to the second shaft 82, and the third gear 93 integrally provided with the second gear 92 rotates the fourth gear loosely secured to the first shaft 81. Further, the fifth gear 95 integrally provided with the fourth gear 94 engages the sixth gear 96 with which the disc 3 is integrally provided, and thus the rotation and the torque are transmitted from the tuning knob 1 to the disc 3.

Figure 3:
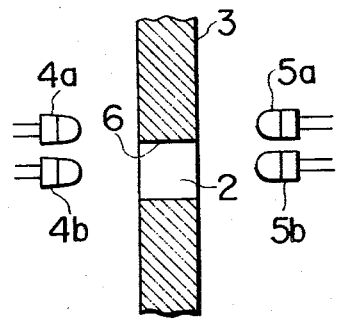
FIG. 3 is a sectional view showing the parallel radially extending side wall configuration of the slit according to the conventional pulse generator.
Figures 4A, 4B, 4C:
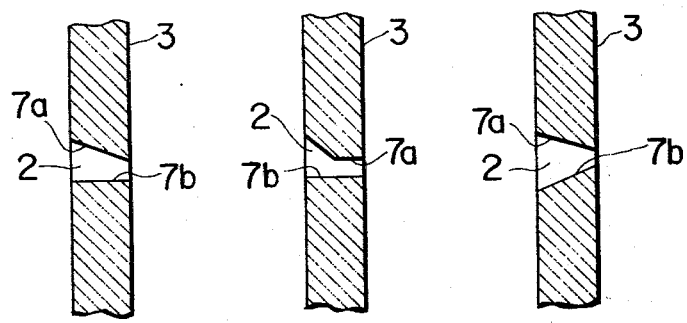
FIGS. 4(a) to 4(c) are the examples showing sectional views in the radial direction of the disc of the inner wall configurations according to this invention.

The inner wall configurations of the slit according to this invention will next be described with reference to FIGS. 4(a) to 4(c) wherein the same reference numerals as in FIG. 3 designate the same portions. FIG. 4(a) is a sectional view of the disc showing one example of the slit configuration. In this example, one of the radially extending inner walls 7a is obliquely formed so that the larger opening of the slit faces the light emitting elements 4a and 4b. FIG. 4(b) shows a second example of the slit configuration wherein a tapered portion is partially formed in one of the inner walls 7a. FIG. 4(c) shows a third example thereof wherein both radially extending inner walls 7a and 7b are obliquely formed. In FIGS. 4(b) and 4(c), the larger opening of the slit also faces the light emitting elements 4a and 4b. Due to such inner wall configurations of the slit, the light reflected from the tapered inner wall does not pass through the slit and, therefore, the reflected light does not enter into the light elements.

In the example shown in FIG. 4(b), though a portion parallel to the optical axis remains in the inner wall 7a, the light incident thereon will be substantially parallel to the optical axis and, therefore, the adverse influence exerted on the elements 5a and 5b by such light is negligible.

Figure 5:
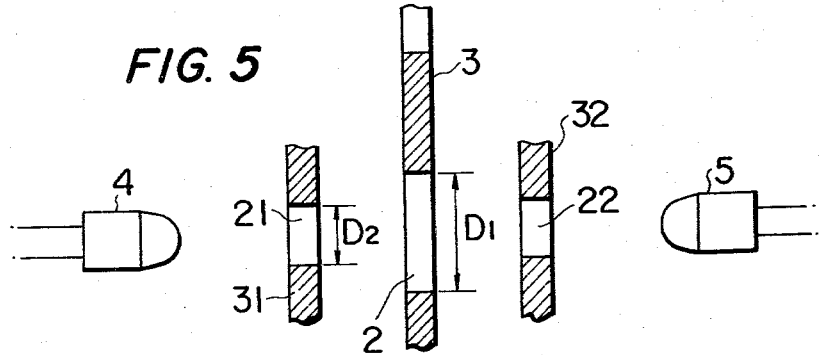
FIG. 5 is a sectional view showing the improved slit structure according to this invention.
Figures 6A, 6B:
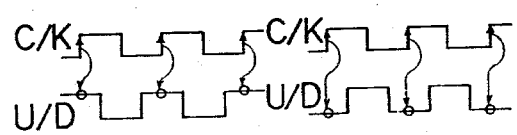
FIGS. 6(a) and 6(b) show the waveforms of the clock pulses and the up-down pulses, the former illustrating the case of up count and the latter the case of down count.

Referring to FIG. 5, there is indicated an embodiment of the disc structure wherein reference numeral 31 designates a fixed plate having a slit 21 therein disposed at the side of light emitting element 4, and reference numeral 32 designates a fixed plate having a slit 22 therein disposed at the side of light receiving element 5. The slit width of the disc 3 is designated by $D_1$ and that of the fixed plate 31 is designated by $D_2$, and $D_1$ is designed to be larger than $D_2$.

In the above disc structure, the irradiating light emitted form the element 4 passes through the slits 21, 2 and 22, and then enters into the element 5. Since the slit width $D_2$ of the fixed plate 31 is designed to be smaller that the slit width $D_1$ of the disc 3, the light passed through the slit 21 is substantially restricted to light which is parallel to the optical axis. (The optical axis is defined in the present specification by the line connecting the elements 4 and 5.) Thus, only the light in parallel to the optical axis passes through the slit 2 and enters into the element 5. According to the pulse generator thus constructed, accurate pulse output is obtainable in accordance with the rotation of the disc 3. Further, when the maximum amount of light passes through the slit 9, the inner wall configuration of the slit 2 does not effect the amount of light incident on the element 5.

In this embodiment, it is of course possible to contact the element 4 into the slit 21 and the element 5 into the slit 22, whereby a more accurate waveform will be obtained from the element 5.

What is claimed is:

1. In a pulse generator of the type having a light emitting element and a light detecting element disposed on opposite sides of a disc having a plurality of apertures therein and a rotatable operating member coupled to said disc through a gear drive mechanism so that rotation of said operating member through one revolution will cause rotation of said disc through more than one revolution to intermittently interrupt the light impinging said detecting element from said emitting element, the improvement comprising:
   each said aperture having a tapered inner surface so that the end of said aperture facing said light emitting element is larger than the end of said aperture facing said light receiving element.

2. A pulse generator as defined in claim 1, wherein each said aperture has a pair of radially extending side surfaces one of which is substantially parallel to an optical axis between the light emitting and light detecting elements and the other of which is at least partially oblique with respect to said axis.

3. A pulse generator as defined in claim 2, wherein said other side includes a first portion oblique to said axis and extending to the surface of said disc adjacent said light emitting element and a second portion substantially parallel to said axis and extending to the surface of said disc adjacent said light detecting element.

4. A pulse generator as defined in claim 2, wherein all of said other surface is oblique to said axis.

5. A pulse generator as defined in claim 1, wherein each said aperture includes a pair of radially extending side surfaces both of which are oblique to the optical axis between said light emitting and light detecting elements.

6. A pulse generator as defined in claim 1, wherein said detecting element at any given time provides an output signal representing the amount of light passing through a single one of said apertures.

* * * * *